United States Patent
Morales et al.

(10) Patent No.: US 8,161,426 B2
(45) Date of Patent: Apr. 17, 2012

(54) METHOD AND SYSTEM FOR SIZING POLYGONS IN AN INTEGRATED CIRCUIT (IC) LAYOUT

(75) Inventors: Domingo Morales, Santiago (CL); Felipe Baytelman, Santiago (CL); Hugo Araya, Santiago (CL)

(73) Assignee: Synopsys, Inc., Mountain View, CA (US)

( * ) Notice: Subject to any disclaimer, the term of this patent is extended or adjusted under 35 U.S.C. 154(b) by 367 days.

(21) Appl. No.: 12/363,159

(22) Filed: Jan. 30, 2009

(65) Prior Publication Data

US 2010/0194779 A1 Aug. 5, 2010

(51) Int. Cl.
*G06F 17/50* (2006.01)
(52) U.S. Cl. ......................................................... 716/55
(58) Field of Classification Search .................... 716/55; 345/660, 472
See application file for complete search history.

(56) References Cited

U.S. PATENT DOCUMENTS

| 5,481,470 A * | 1/1996 | Snead et al. ................... 700/119 |
| 6,128,767 A | 10/2000 | Chapman |
| 6,816,170 B1 | 11/2004 | Udeshi |
| 2006/0248496 A1 | 11/2006 | Sezginer |

* cited by examiner

*Primary Examiner* — Vuthe Siek
*Assistant Examiner* — Aric Lin
(74) *Attorney, Agent, or Firm* — Park, Vaughan, Fleming & Dowler LLP (57) ABSTRACT

One embodiment of the present invention provides a system that sizes a polygon in a layout. During operation, the system receives a polygon which is to be sized by a sizing amount. The system then selects one or more vertices of the polygon. Next, the system replaces each selected vertex with a set of replacement vertices, and subsequently assigns a projection path to each replacement vertex in the set of replacement vertices. The system next performs a sizing operation on the polygon according to the sizing amount. During the sizing operation, the system moves each replacement vertex in the set of replacement vertices along the assigned projection path, thereby creating a clipping on the angle associated with the selected vertex. Furthermore, this sizing operation is continuous: similar output polygons are obtained for similar sizing amounts.

23 Claims, 9 Drawing Sheets

METHOD AND SYSTEM FOR SIZING POLYGONS IN AN INTEGRATED CIRCUIT (IC) LAYOUT

BACKGROUND

1. Field

Embodiments of the present invention generally relate to techniques for designing and manufacturing integrated circuits (ICs). More specifically, embodiments of the present invention relate to a technique for correctly sizing polygons in a mask layout during mask data preparation.

2. Related Art

The dramatic improvements in integrated circuit (IC) integration densities in recent years have largely been made possible by corresponding improvements in semiconductor design and manufacturing technologies.

One such design and manufacturing technology involves sizing (i.e., shrinking/undersizing or growing/oversizing) polygons in an IC mask layout (hereinafter "layout") during mask data preparation. To change the size of a polygon, each edge in an initial geometry can be displaced at a constant speed to achieve a constant sizing distance. Some application requires that the shape of the resized polygon be substantially similar to the original polygon. For example, this is a requirement when derived layers are generated or an etch bias is applied to an edge.

However, conventional polygon-sizing techniques are often based on heuristics, and when they are used to process certain polygon geometries with large sizing distances, they can modify the shape significantly. For example, when using conventional sizing techniques to downsize a polygon containing a concave vertex associated with an acute angle, the concave vertex can self-intersect on the polygon, which splits the original polygon into two new polygons (referred to as a "split" event). Such a split event changes the original polygon geometry. On the other hand, when these techniques are used to oversize a polygon containing a convex vertex of an acute angle, the acute angle can be projected very far from the original geometry, which also results in an unacceptable change to the shape of the polygon.

Hence, there is a need for a polygon-sizing tool that can be used to resize polygons without the above-described problems.

SUMMARY

One embodiment of the present invention provides a system that sizes a polygon in a layout. During operation, the system receives a polygon which is to be sized by a sizing amount. The system then selects one or more vertices of the polygon. Next, the system replaces each selected vertex with a set of replacement vertices, and subsequently assigns a projection path to each replacement vertex in the set of replacement vertices. The system next performs a sizing operation on the polygon according to the sizing amount. During the sizing operation, the system moves each replacement vertex in the set of replacement vertices along the assigned projection path, thereby creating a clipping on the angle associated with the selected vertex. Furthermore, this sizing operation is continuous: similar output polygons are obtained for similar sizing amounts.

In a variation, the system selects a vertex of the polygon by selecting the vertex of an acute angle in the polygon.

In a variation, the system selects a vertex of the polygon according to one or more rules.

In a variation, the system performs the sizing operation on the polygon by generating a new edge in the polygon between a pair of replacement vertices.

In a variation, the system assigns a projection speed to each replacement vertex in the set of replacement vertices prior to performing the sizing operation on the polygon. Next, during the sizing of the polygon, the system moves each replacement vertex in the set of replacement vertices along the assigned projection path at the assigned projection speed.

In a further variation, the system receives a set of clipping criteria for the angle associated with the selected vertex. The system subsequently determines the projection path and the projection speed for each replacement vertex in the set of replacement vertices based on the set of clipping criteria.

In a variation, a first projection path for a first replacement vertex in the set of replacement vertices is different from a second projection path for a second replacement vertex in the set of replacement vertices.

In a further variation, the system controls the angle between the first projection path and the second projection path to control the amount of clipping on the angle associated with the selected vertex.

In a variation, the system performs the sizing operation on the polygon by one of: oversizing the polygon by the sizing amount, or undersizing the polygon by the sizing amount.

In a variation, the system performs the sizing operation on the polygon by propagating an edge of the polygon in a direction perpendicular to the edge, thereby maintaining the topology of the polygon during sizing.

In a variation, the system performs the sizing operation on the polygon by moving an unselected vertex of the polygon along the bisector direction of the associated angle.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not limited to the embodiments shown, but is to be accorded the widest scope consistent with the claims.

The data structures and code described in this detailed description are typically stored on a computer-readable storage medium, which may be any device or medium that can store code and/or data for use by a computer system. This includes, but is not limited to, volatile memory, non-volatile memory, magnetic and optical storage devices such as disk drives, magnetic tape, CDs (compact discs), DVDs (digital versatile discs or digital video discs), or other media capable of storing computer-readable media now known or later developed.

Integrated Circuit Design Flow

Figure 1:
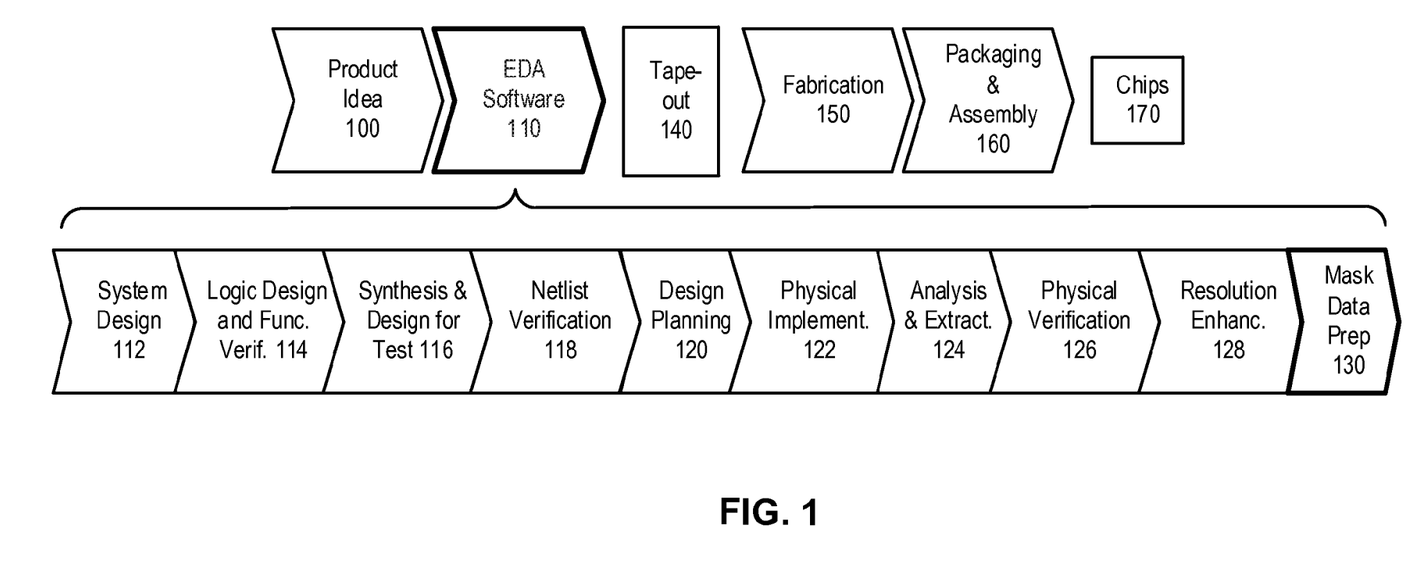
FIG. 1 illustrates various stages in the design and fabrication of an integrated circuit.

FIG. 1 illustrates various steps in the design and fabrication of an integrated circuit. The process starts with the generation of a product idea (stage 100), which is realized using an Electronic Design Automation (EDA) software design process (stage 110). When the design is finalized, it can be taped-out (stage 140). After tape-out, the fabrication process is consummated (stage 150) and packaging and assembly processes (stage 160) are performed which ultimately result in finished chips (stage 170).

The EDA software design process (stage 110), in turn, comprises stages 112-130, which are described below. Note that this design flow description is for illustration purposes only. This description is not meant to limit the present invention. For example, an actual integrated circuit design may require a designer to perform the design stages in a different sequence than the sequence described herein. The following discussion provides further details of the stages in the design process.

System design (stage 112): The designers describe the functionality to implement. They can also perform what-if planning to refine the functionality and to check costs. Hardware-software architecture partitioning can occur at this stage. Exemplary EDA software products from SYNOPSYS, INC. that can be used at this stage include MODEL ARCHITECT®, SABER®), SYSTEM STUDIO®), and DESIGNWARE® products.

Logic design and functional verification (stage 114): At this stage, the VHDL or Verilog code for modules in the system is written and the design is checked for functional accuracy. More specifically, the design is checked to ensure that it produces the correct outputs. Exemplary EDA software products from SYNOPSYS, INC. that can be used at this stage include VCS®, VERA®, DESIGNWARE®, MAGELLAN®, FORMALITY®, ESP® and LEDA® products.

Synthesis and design (stage 116): Here, the VHDL/Verilog is translated to a netlist. The netlist can be optimized for the target technology. Additionally, tests can be designed and implemented to check the finished chips. Exemplary EDA software products from SYNOPSYS, INC. that can be used at this stage include DESIGN COMPILER®, PHYSICAL COMPILER®, TEST COMPILER®, POWER COMPILER®, FPGA COMPILER®, TETRAMAX®, and DESIGNWARE® products.

Netlist verification (stage 118): At this stage, the netlist is checked for compliance with timing constraints and for correspondence with the VHDL/Verilog source code. Exemplary EDA software products from SYNOPSYS, INC. that can be used at this stage include FORMALITY®, PRIMETIME®, and VCS® products.

Design planning (stage 120): Here, an overall floor plan for the chip is constructed and analyzed for timing and top-level routing. Exemplary EDA software products from SYNOPSYS, INC. that can be used at this stage include ASTRO® and IC COMPILER® products.

Physical implementation (stage 122): The placement (positioning of circuit elements) and routing (connection of the same) occurs at this stage. Exemplary EDA software products from SYNOPSYS, INC. that can be used at this stage include the ASTRO® and IC COMPILER® products.

Analysis and extraction (stage 124): At this stage, the circuit function is verified at a transistor level; this, in turn, permits what-if refinement. Exemplary EDA software products from SYNOPSYS, INC. that can be used at this stage include ASTRORAIL®, PRIMERAIL®, PRIMETIMEL®, and STAR RC/XT® products.

Physical verification (stage 126): In this stage, the design is checked to ensure correctness for manufacturing, electrical issues, lithographic issues, and circuitry. Exemplary EDA software products from SYNOPSYS, INC. that can be used at this stage include the HERCULES® product.

Resolution enhancement (stage 128): This stage involves geometric manipulations of the layout to improve manufacturability of the design. Exemplary EDA software products from SYNOPSYS, INC. that can be used at this stage include PROTEUS®, PROTEUS®AF, and PSMGED® products.

Mask data preparation (stage 130): This stage provides the tape-out data for production of masks to produce finished chips. Exemplary EDA software products from SYNOPSYS, INC. that can be used at this stage include the CATS® family of products.

Embodiments of the present invention can be used during one or more of the above-described steps. Specifically, one embodiment of the present invention can be used during the mask data preparation step 130.

Post-Processing Clipping of Acute Angles of a Sized Polygon

Figure 2:
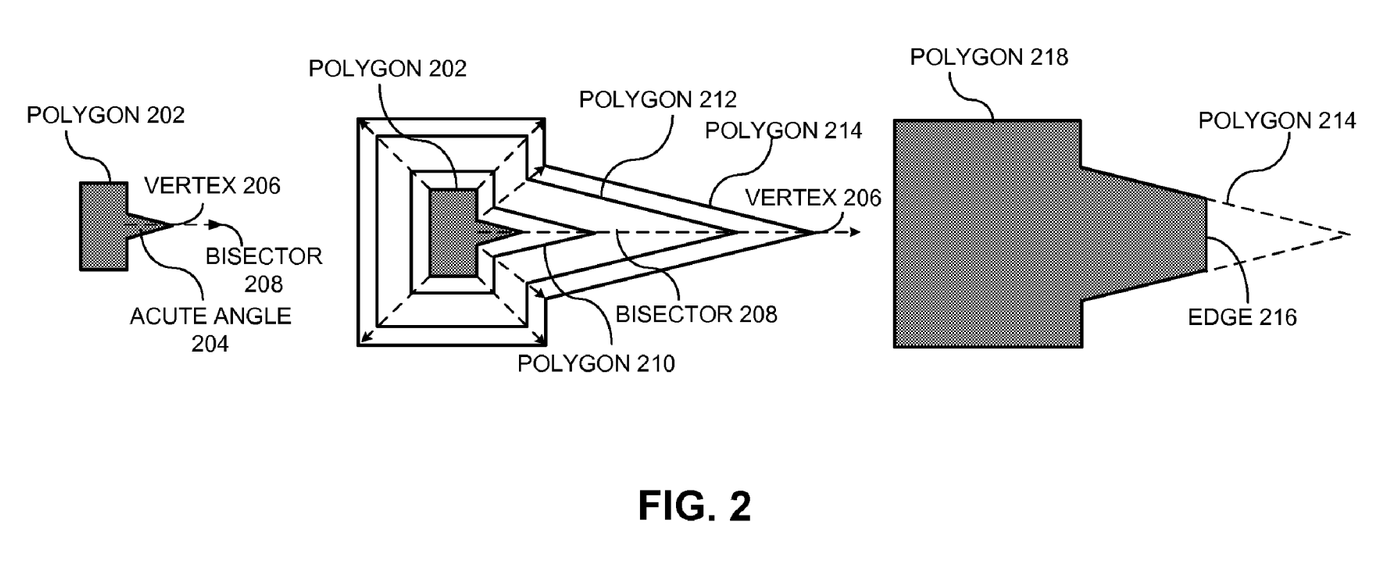
FIG. 2 illustrates an exemplary polygon-sizing operation based on a wave-front sizing process.

Some polygon-sizing techniques are based on a wave-front sizing process. During a typical wave-front sizing process of a polygon, each vertex of the polygon moves at a constant speed along the corresponding bisector direction, and each edge of the polygon propagates at a constant speed along a direction perpendicular to the edge. FIG. 2 illustrates an exemplary polygon-sizing operation based on a wave-front sizing process.

As illustrated in FIG. 2, an input polygon 202 which comprises an acute angle 204 is to be oversized by a specified sizing amount. During the sizing process, each of the vertices in polygon 202 travels outward along an associated bisector.

For example, vertex 206 of acute angle 204 travels along bisector 208 of acute angle 204 toward right. Moreover, each edge of polygon 202 propagates outward and remains parallel to the corresponding edge in polygon 202, thus resembling the propagation of a wave-front. The middle subplot in FIG. 2 illustrates sized polygons 210 and 212 at different sizing distances during the sizing process, and also a final sized polygon 214 at the full sizing amount. Note that during the wave-front based sizing process, vertex 206 of acute angle 204 travels significantly faster than other vertices in polygon 202, thereby causing acute angle 204 to project very far from the original position in polygon 202.

However, most applications that involve polygon sizing require the projection of an acute angle to be limited. For example, Electronic Design Automation (EDA) applications require sized designs to stay close to the original shape to prevent separated parts of the design from touching each other.

In order to prevent such undesirable sizing of the acute angles, a post-processing clipping operation is often performed on sized polygons to clip away a portion of a projected acute angle. For example, in FIG. 2, the final sized polygon 214 is clipped along edge 216 to obtain a post-processing clipped output polygon 218.

Limitation of Post-processing Clipping

FIGS. 3A-3D illustrate using a post-processing clipping technique to modify projected acute angles in sized polygons associated with different sizing amounts.

Figure 3A:
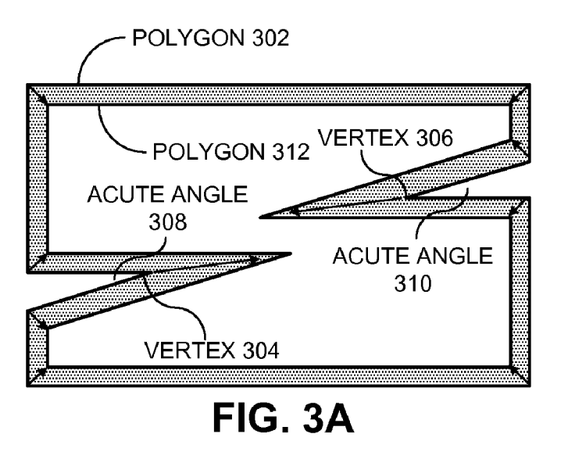
FIG. 3A illustrates the process of sizing an input polygon by a small sizing distance without performing a clipping operation.

More specifically, FIG. 3A illustrates the process of sizing an input polygon 302 by a small sizing distance without performing a clipping operation. As shown in FIG. 3A, an original input polygon 302 (the outer polygon) comprises two concave vertices 304 and 306 which belong to two internal acute angles 308 and 310, respectively. Polygon 302 is subsequently shrunk to obtain a sized polygon 312 (the inner polygon) through a wave-front sizing process. During the sizing operation, each of the vertices in polygon 302 moves inward along an associated bisector direction (shown by the arrows), and each edge of the polygon propagates inward along the direction perpendicular to that edge, therefore remaining parallel to the original edge. In the sized polygon 312, acute angles 308 and 310 still exist and have moved much closer to each other without touching.

Figure 3B:
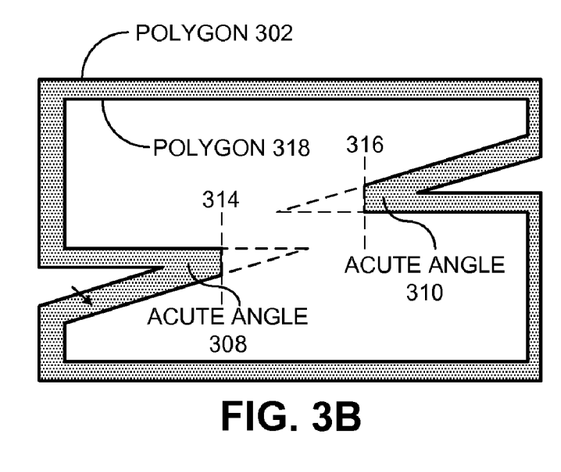
FIG. 3B illustrates clipping the acute angles in the sized polygon through a post-processing clipping operation.

FIG. 3B illustrates clipping the acute angles in sized polygon 312 through a post-processing clipping operation. As illustrated in FIG. 3B, portions of the sized acute angles 308 and 310 in sized polygon 312 are clipped along clip lines 314 and 316 to generate a modified sized polygon 318. Note that the clipped acute angles 308 and 310 are further apart from each other, and the topology of the clipped polygon 318 resembles the original input polygon 302 more than the unclipped polygon 312 does.

Figure 3C:
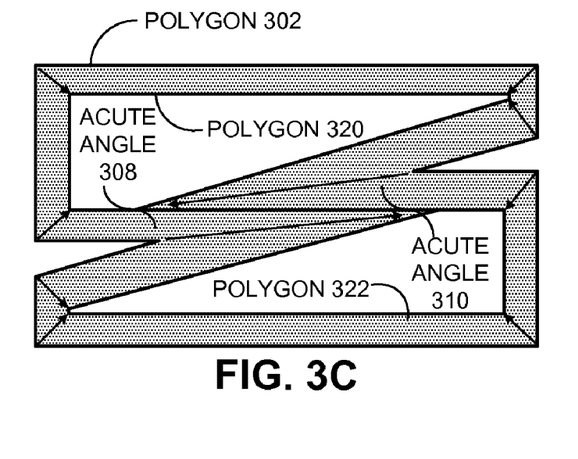
FIG. 3C illustrates the process of sizing the input polygon by a large sizing distance without performing a clipping operation.

FIG. 3C illustrates the process of sizing the input polygon 302 by a large sizing distance without performing a clipping operation. As shown in FIG. 3C, during the sizing operation, each of the vertices in polygon 302 continues to move inward along the associated bisector, and each edge continues to propagate inward while remaining parallel to the original edge. At the end of the sizing process, acute angles 308 and 310 merge and disappear, while vertices 304 and 306 are morphed into new vertices of non-acute angles. Furthermore, the original polygon 302 is split into two new polygons 320 and 322, which changes the topology of input polygon 302 completely.

Figure 3D:
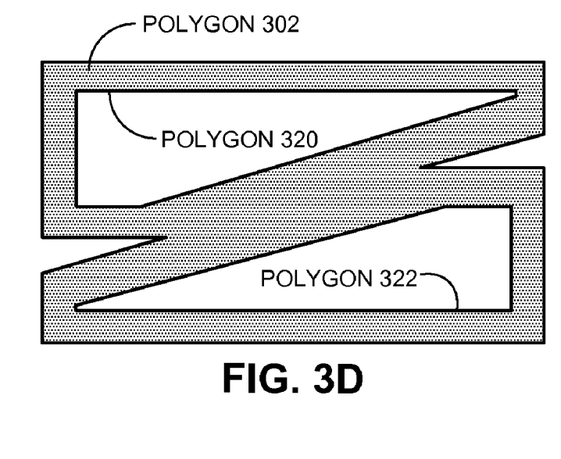
FIG. 3D illustrates an attempt to perform a post-processing clipping operation after sizing the input polygon with the large sizing distance.

FIG. 3D illustrates an attempt to perform a post-processing clipping operation after sizing input polygon 302 by the large sizing distance. As illustrated in FIG. 3D, because acute angles do not exist in newly created polygons 320 and 322, post-processing clipping cannot be applied to the sized output polygons.

In summary, the post-processing clipping technique applies clipping to acute angles in a sized output polygon. However, this post-processing technique may not work consistently when different sizing distances are used. In particular, the post-processing clipping technique does not prevent topology changes during the sizing process, such as edge-merging or geometry-splitting. When the topology has changed after the sizing, the post-processing clipping technique may not be performed on the sized output polygon.

Pre-Processing Clipping and Polygon Sizing

One embodiment of the present invention provides a polygon-sizing technique which involves pre-processing an input polygon prior to performing sizing on the polygon. More specifically, the pre-processing involves selecting certain vertices in the input polygon, and replacing each selected vertex with two or more new vertices. Which vertices to select from the input polygon can depend on a number of considerations. In some embodiments, the vertices of acute angles are selected. By selecting such vertices, the pre-processing and subsequent sizing process can generate the desired clipping effects on these acute angles without performing post-processing clipping. In some embodiments, the vertices of non-acute angles in the input polygon can also be selected according to specific sizing requirements.

In some embodiments of the present invention, each selected vertex is replaced with two or more replacement vertices at the same spot as the selected vertex. Note that these replacement vertices initially have the same bisector as the selected vertex. Furthermore, each replacement vertex can be assigned a customized projection path, and each customized projection path can be the same or different from the corresponding bisector. Hence, these predetermined projection paths determine how each replacement vertex propagates during a subsequent sizing process. In some embodiments, the replacement vertices for a vertex of an acute angle combined with the associated projection paths facilitate producing a desired clipping effect on the acute angle during the sizing process, which is discussed in more detail below in conjunction with FIGS. 4A-4B and 5A-5B.

Figure 4A:
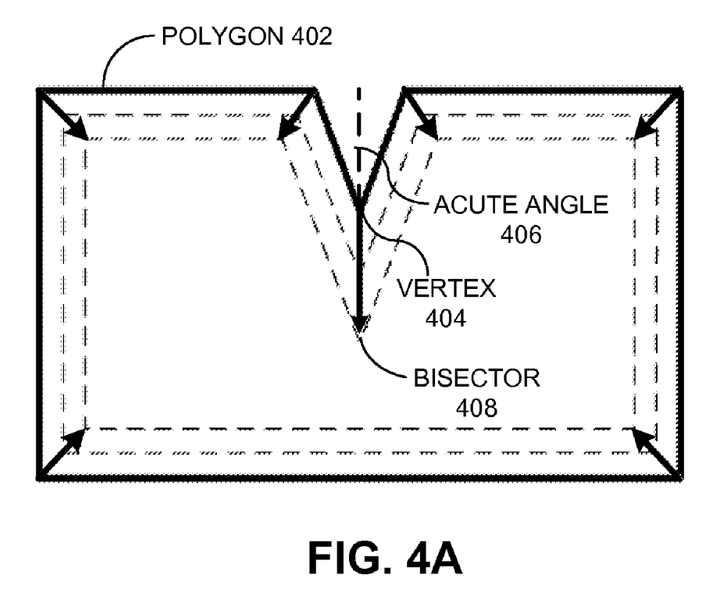
FIG. 4A illustrates a typical wave-front sizing operation on a polygon without using pre-processing clipping.
Figure 4B:
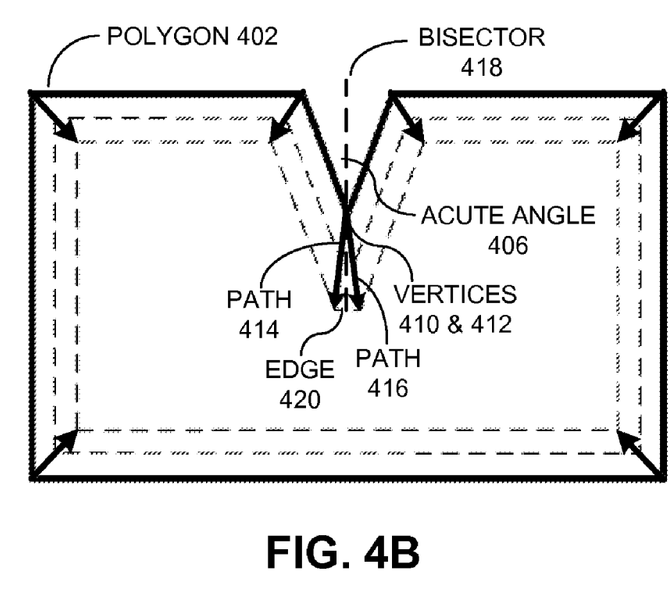
FIG. 4B illustrates sizing a polygon using a modified wave-front sizing operation in conjunction with pre-processing clipping in accordance with an embodiment of the present invention.

FIGS. 4A and 4B provide a comparison between the original wave-front sizing operation without using pre-processing clipping and a modified wave-front sizing operation in conjunction with a pre-processing clipping process.

More specifically, FIG. 4A illustrates a typical wave-front sizing operation on a polygon 402 without using pre-processing clipping. As shown in FIG. 4A, during an undersizing operation, each of the vertices of polygon 402 moves inward along the associated bisector direction, indicated by the arrows. For example, vertex 404 of acute angle 406 moves downward along its bisector 408. Furthermore, each edge in polygon 402 propagates in a direction perpendicular to that edge in a wave-front manner. As a result, vertex 404 travels quickly downward toward the bottom edge of the sized polygons (shown by the dashed geometries).

FIG. 4B illustrates sizing polygon 402 using a modified wave-front sizing operation in conjunction with pre-processing clipping in accordance with an embodiment of the present invention.

More specifically, prior to performing the sizing, vertex 404 of acute angle 406 is selected and replaced with two replacement vertices 410 and 412, which are assigned predetermined projection paths 414 and 416, respectively. Although projection paths 414 and 416 are shown to be on equal and opposite sides of bisector 418, other embodiments of the two projection paths do not have to be symmetrical with respect to bisector 418. In some embodiments, replacement vertices 410 and 412 are assigned predetermined projection speeds, which can be the same or different. After the pre-processing operation on polygon 402, the replacement vertices contain the information on how the sizing and customized clipping will occur next, which will modify the topology of input polygon 402.

Next, during the subsequent sizing process, a modified wave-front sizing operation is performed on polygon 402. More specifically, each of the unselected vertices in polygon 402 still moves inward along an associated bisector, whereas each of the replacement vertices moves inward along the associated predetermined projection path. Furthermore, each edge in polygon 402 propagates inward along a direction perpendicular to the original edge, hence remaining parallel to the original edge. Meanwhile, the replacement vertices 410 and 412 move in different directions, therefore creating a new edge 420 between them. This newly created edge 420 also propagates along a fixed direction determined by the predetermined projection paths. Because the predetermined projection paths for the replacement vertices are generally different from a bisector direction, we refer to the above sizing process as a modified wave-front sizing process. Note that the modified wave-front sizing process illustrated in FIG. 4B produces a desired clipping effect to limit the projection of acute angle 406.

Figure 5A:
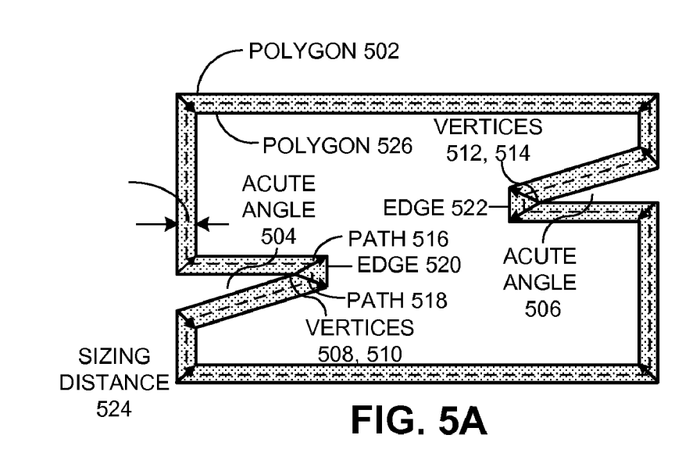
FIG. 5A illustrates a process of modified wave-front sizing of a pre-processed input polygon with a small sizing distance in accordance with an embodiment of the present invention.
Figure 5B:
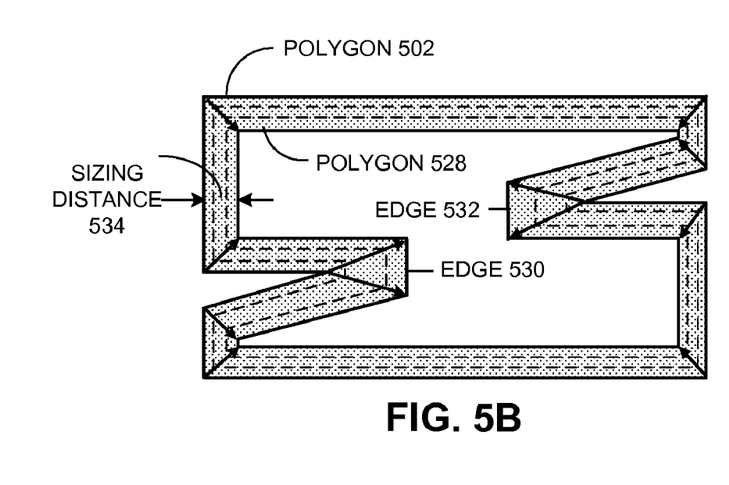
FIG. 5B illustrates a process of modified wave-front sizing of the pre-processed input polygon with a large sizing distance in accordance with an embodiment of the present invention.
Figure 5C:
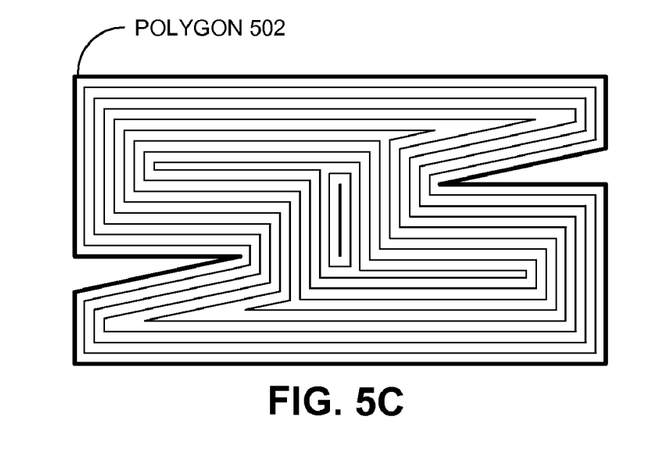
FIG. 5C illustrates a process of modified wave-front sizing of the pre-processed input polygon when the sizing distance is continuously changed in accordance with an embodiment of the present invention.

FIGS. 5A-5C illustrate the process of modified wave-front sizing of an input polygon 502 with pre-processing clipping in accordance with an embodiment of the present invention.

More specifically, FIG. 5A illustrates a process of modified wave-front sizing of a pre-processed input polygon 502 by a small sizing distance in accordance with an embodiment of the present invention.

Note that the original input polygon 502, which includes two acute angles 504 and 506, is substantially identical to the input polygon 302 in FIG. 3. However, prior to sizing polygon 502, polygon 502 is pre-processed to modify the acute angles 504 and 506. More specifically, the two vertices of acute angles 504 and 506 are selected, and each selected vertex is then replaced by two replacement vertices: vertices 508 and 510 for acute angle 504, and vertices 512 and 514 for acute angle 506. Next, each replacement vertex is assigned a customized projection path. In this embodiment, in order to create the clipping effect shown in FIG. 3B, each replacement vertex in FIG. 5A is assigned a projection path indicated by an arrow originating from that vertex. For example, vertices 508 and 510 are assigned projection paths 516 and 518, respectively. Because the two vertices originating from the same selected vertex then project in different directions, a new edge is created between the pair of vertices during the subsequent sizing process, shown as edges 520 and 522 at the tips of acute angles 504 and 506, respectively. Thus, during this sizing process, clipping effects similar to those in FIG. 3B are reproduced in polygon 502.

Note that the customized projection path for each replacement vertex can be used to control the amount of clipping after the sizing. More specifically, when a pair of projection paths forms a larger angle, a greater clipping effect can be achieved. Otherwise, a small clipping effect is obtained. An extreme case is when all the replacement vertices at the same replaced vertex project along the original bisector direction. In this case, no clipping effect is created regardless of the sizing distance.

Also in FIG. 5A, the sizing process after the pre-processing uses a modified wave-front sizing operation. More specifically, each of the unselected vertices in polygon 502 moves inward along an associated bisector (shown as arrows bisecting the associated angle), and each of the replacement vertices moves inward along the customized projection path. Furthermore, each edge in polygon 502 propagates inward along a direction perpendicular to the original edge, and hence remains parallel to the original edge. The newly created edges 520 and 522 also propagate along the fixed directions determined by the customized projection paths of the replacement vertices. The sizing process is finished when a sizing distance 524 is reached. At this point, a sized polygon 526 is obtained which includes two "clipped" acute angles 504 and 506. Hence, by pre-processing the selected vertices and using the modified wave-front sizing operation, we obtain a sized polygon having undergone desired clipping similar to the post-processing clipped polygon 318 in FIG. 3B, thus mitigating the projection of acute angles as illustrated in FIG. 3A.

In contrast, FIG. 5B illustrates a process of modified wave-front sizing of the pre-processed input polygon 502 with a large sizing distance in accordance with an embodiment of the present invention.

In this embodiment, input polygon 502 is pre-processed in the same manner as in FIG. 5A, such that each vertex of the acute angles is replaced by two vertices having customized projection paths. During the subsequent sizing operation, polygon 502 is shrunk according to the modified wave-front sizing operation, wherein each vertex of polygon 502 moves in the direction indicated by the arrows in FIG. 5B. The sizing process is finished when a sizing distance 534 is reached. At this point, a sized polygon 528 is obtained which includes two clipping edges 530 and 532. Hence, by pre-processing the selected vertices and using the modified wave-front sizing operation, the sized polygon 528 maintains the corrected topology of input polygon 502 while including the desired clipping to prevent the acute angles from projecting too far. Furthermore, this pre-processing clipping technique also prevents acute angles 504 and 506 from merging at such a large sizing distance, therefore ensuring a continuous evolution of the sized output as the sizing value is modified. For example, FIG. 5C illustrates a process of modified wave-front sizing of the pre-processed input polygon 502 when the sizing distance is continuously changed in accordance with an embodiment of the present invention. Note that as the sizing distance continues to increase, the sized polygon evolution is continuous. Even when there is merging of some parts of the polygon, the wave-front sized polygon evolution remains continuous. In comparison, for a substantially identical sizing distance, the post-processing clipping technique illustrated in FIG. 3D fails to clip the sized output and is unable to prevent acute angles 308 and 310 from interacting with each other, thereby generating a non-continuous evolution of the output polygon, resulting in this case into polygons 320 and 322.

Figure 6:
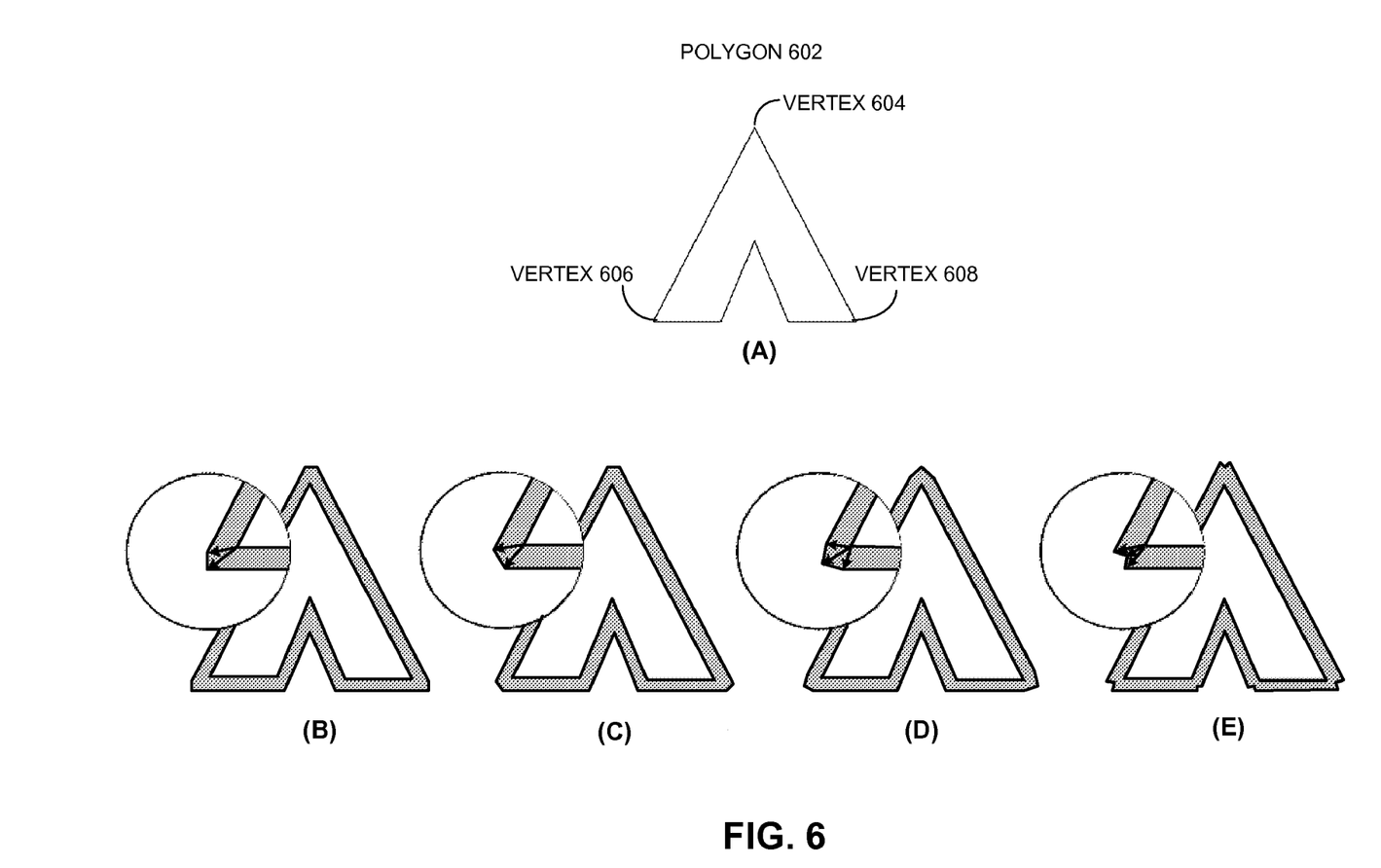
FIG. 6 illustrates some variations on pre-processing selected vertices in an input polygon and different clipping styles associated with these variations in accordance with an embodiment of the present invention.

FIG. 6 illustrates some variations on pre-processing selected vertices in an input polygon and different clipping styles associated with these variations in accordance with an embodiment of the present invention.

Specifically, subplot A in FIG. 6 illustrates an original input polygon 602, which comprises a number of acute angles. During pre-processing, vertices 604, 606 and 608 are selected, and each is replaced with multiple vertices. In each of the subplots B-E, the shaded area represents the same amount of sizing from the original polygon 602 to a corresponding sized polygon. However, each subplot illustrates a sized polygon with a different type of clipping.

More specifically, in subplot B, each selected vertex is replaced with two replacement vertices, and these two vertices are assigned customized projection paths indicated in the blown-up window. Furthermore, the two vertices are also assigned customized projection speeds, wherein one vertex moves faster than the other vertex. These pre-processing conditions generate the clipped edges which are shown in the blown-up window subplot B.

In subplot C, each selected vertex is also replaced with two replacement vertices, and these two vertices are assigned customized projection paths indicated in the associated blown-up window. In this embodiment, the two vertices are assigned equal projection speeds. These pre-processing conditions generate the clipped edges in the sized polygon in a manner similar to those in FIG. 4B.

In subplot D, each selected vertex is replaced with three replacement vertices, and these three vertices are assigned customized projection paths indicated in the associated blown-up window. In this embodiment, two of the replacement vertices are assigned equal projection speeds, while the third vertex is assigned a faster projection speed. As a result, each of the clipped acute angles in the sized polygon includes two clipped edges. The embodiment shown in subplot E also replaces each selected vertex with three vertices. However, the customized speeds for the replacement vertices are different from those in subplot D. Hence, the clipped edges shown in the associated blown-up plot are slightly different from those in subplot D.

Generally, during pre-processing (clipping) of an input polygon, at least the following parameters can be judiciously determined based on the design requirements: (1) a number of replacement vertices for each selected vertex; (2) the projection path for each of the replacement vertices; (3) the projection speed for each of the replacement vertices. During the subsequent sizing process, each of the replacement vertices is projected along the predetermined projection path at the predetermined projection speed, thus generating desired clipping on each selected vertex.

Process for Sizing an Input Polygon

Figure 7:
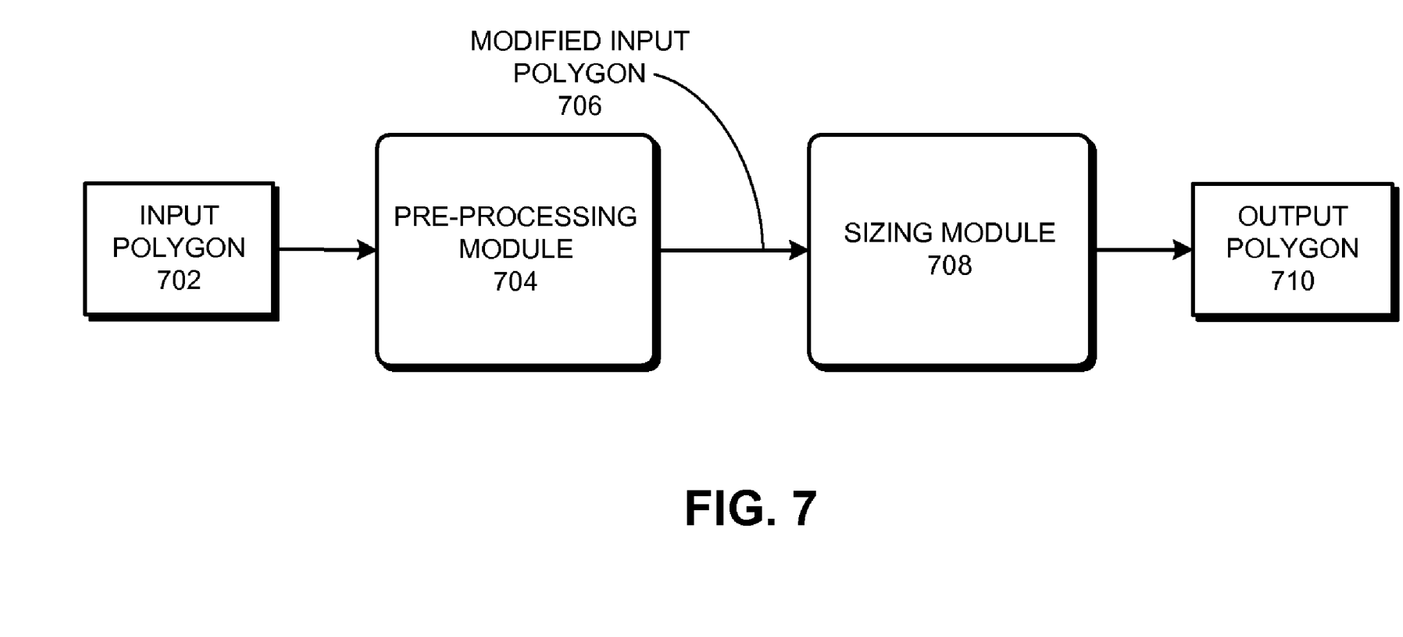
FIG. 7 presents a flow diagram illustrating a process for sizing an input polygon in accordance with an embodiment of the present invention.

FIG. 7 presents a flow diagram illustrating a process for sizing an input polygon in accordance with an embodiment of the present invention.

The process starts with receiving an input polygon 702. The process also receives information on a sizing amount and a manner of sizing (i.e., oversizing or undersizing). In some embodiments, the process additionally receives one or more rules which can be used for selecting one or more vertices of input polygon 702. For example, one such rule requires selecting vertices of some or all the acute angles in input polygon 702. In other embodiments, one or more other rules may be used for selecting vertices. Furthermore, the input information can also include a description of the desired clipping to be achieved on the angle of a selected vertex. This clipping description can include the amount of clipping, direction of clipping, and a number of new edges on the clipped structure, among others.

Referring to FIG. 7, note that a pre-processing module 704 receives input polygon 702, and performs pre-processing on input polygon 702. More specifically, the pre-processing includes selecting one or more vertices of the received polygon based on the received selection rules, replacing each of the selected vertices with two or more replacement vertices, and then assigning a customized projection path to each of the replacement vertices. In some embodiments of the present invention, the customized projection paths for the replacement vertices are determined based on the description of the clipping of the angle of the selected vertex. In some embodiments, the pre-processing also includes assigning a customized projection speed to each of the replacement vertices, wherein these customized projection speeds can also be determined based on the description of the clipping of the angle of the selected vertex.

The pre-processing by pre-processing module 704 modifies input polygon 702 to create a modified input polygon 706 as the output. Modified input polygon 706 is the input to a sizing module 708, which performs a modified wave-front sizing operation on modified input polygon 706 according to the specified sizing amount. Sizing module 708 subsequently generates an output polygon 710. In some embodiments of the present invention, the modified wave-front sizing operation involves moving each vertex in the set of replacement vertices along the customized projection path at the customized projection speed. Furthermore, the modified wave-front sizing operation involves moving an unselected vertex of the polygon along the bisector direction of the associated angle, and propagating an edge of the polygon in a direction perpendicular to that edge. Consequently, output polygon 710 maintains the topology of input polygon 702, and also includes the desired clipping of the angles of the selected vertices according the description of the clipping.

Figure 8:
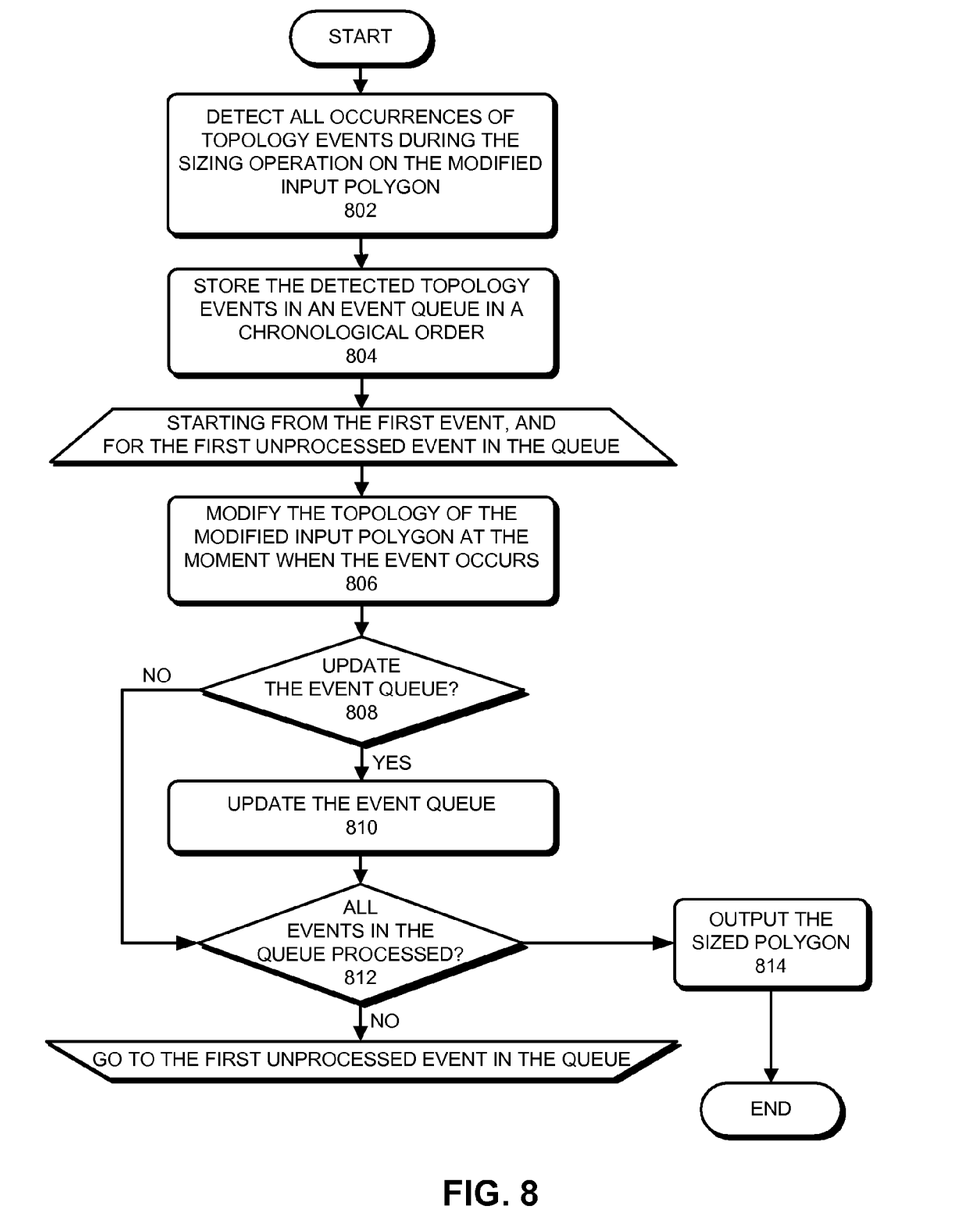
FIG. 8 presents a flowchart illustrating a sizing process performed by the sizing module in FIG. 7 in accordance with an embodiment of the present invention.

FIG. 8 presents a flowchart illustrating a sizing process performed by sizing module 708 in FIG. 7 in accordance with an embodiment of the present invention.

The sizing process starts with an event detection step 802, which detects all possible occurrences of different types of topology changes during the sizing operation on the modified input polygon. We refer to the occurrences of these topology changes as "events." For example, an "edge" event occurs when an existing edge disappears; a "split" event occurs when the input polygon splits into two polygons during the sizing operation, and a "merge" event occurs when two separate parts of the input polygon merge during the sizing operation. In some embodiments, the sizing process only detects those events taking place within the specified sizing distance.

Next, the sizing process stores the detected topology events in an event queue (e.g., a min-priority queue) in the order of the corresponding sizing distances at which the events take place (step 804). The sizing process then starts processing the events stored in the event queue in the chronological order.

More specifically, starting from the first event in the event queue, the sizing process modifies the topology of the modified input polygon at the moment when the first event occurs (step 806).

In some embodiments, during the step of topology modification, the sizing process first identifies vertices involved in the event being processed. In one embodiment, each identified vertex is a replacement vertex in the modified input polygon. Next, for each identified vertex, the sizing process computes a new customized projection path and a new customized projection speed for this vertex. For example, the new projection path and speed can be computed based on the propagation speeds of two adjacent edges to the identified vertex. More specifically, the new projection path and speed can be computed as the vector sum of the two propagation speeds (including both the magnitude and the direction). In some embodiments in step 806, the sizing process also determines a new "origin" point for the new topology. In one embodiment, this new origin point is obtained from the original topology of the modified input polygon by identifying the intersection of the projections of the associated input edges.

After modifying the topology, the sizing process next determines if the event queue needs to be updated (step 808). In some embodiments, the event queue is only updated under two situations: (1) if some events in the event queue are no longer valid after the topology change made in step 806; or (2) if one or more new events occur as a consequence of the topology change made in step 806. In the first case, the events no longer valid are removed from the event queue, whereas in the second case, the new events are added into the event queue in the order of occurrence. Hence, the system updates the event queue if necessary (step 810). Note that those new events occurring at sizing distances greater than the specified sizing amount are not stored in the event queue and may be discarded.

Next, the sizing process determines if all the events in the event queue have been processed (step 812). If so, the sizing process is complete, and the sizing process outputs the desired sized polygon (step 814). Otherwise, the sizing process selects the first unprocessed event in the event queue and repeats steps 806-812 for this event.

Figure 9:
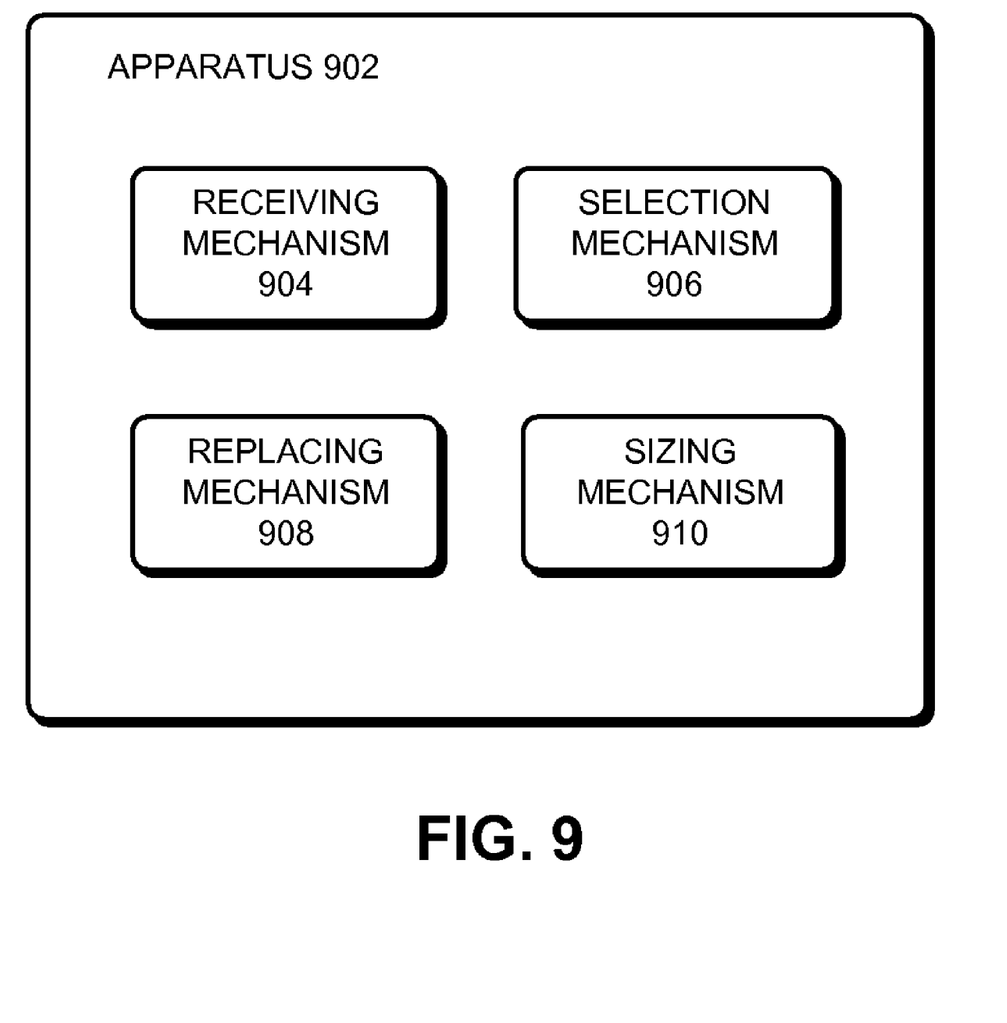
FIG. 9 illustrates an apparatus that performs a sizing operation on a polygon in a layout in accordance with an embodiment of the present invention.

FIG. 9 illustrates an apparatus 902 that performs a sizing operation on a polygon in a layout in accordance with an embodiment of the present invention.

Apparatus 902 can comprise mechanisms which communicate with one another via a wired or wireless communication channel. Specifically, apparatus 902 can comprise a receiving mechanism 904, a selection mechanism 906, a replacing mechanism 908, and a sizing mechanism 910. A mechanism may be realized using one or more integrated circuits or as a module of a general purpose processor. Apparatus 902 can be part of a computer system.

In some embodiments, receiving mechanism 904 may be configured to receive a polygon which is to be sized by a sizing amount; selection mechanism 906 may be configured to select one or more vertices of the polygon; replacing mechanism 908 may be configured to replace the selected vertex with a set of replacement vertices and subsequently to assign a projection path to each vertex in the set of replacement vertices; and sizing mechanism 910 may be configured to perform a sizing operation on the polygon according to the sizing amount. During the sizing operation, the sizing mechanism may move each vertex in the set of replacement vertices along the assigned projection path, thereby clipping the angle associated with the selected vertex.

The foregoing descriptions of embodiments of the present invention have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. A method for sizing a polygon in a layout, comprising:
   receiving a polygon which is to be sized by a sizing amount;
   selecting a vertex of the polygon, wherein the vertex is formed by a first edge and a second edge;
   replacing the selected vertex with a set of replacement vertices, which includes a first replacement vertex and a second replacement vertex;
   assigning, by computer, a projection path to each replacement vertex in the set of replacement vertices, which includes assigning a first projection path and a second projection path to the first replacement vertex and the second replacement vertex, respectively, wherein the first projection path and the second projection path are not perpendicular to either the first edge or the second edge; and
   sizing the polygon according to the sizing amount, which involves moving each replacement vertex in the set of replacement vertices along the assigned projection path, thereby creating a clipping on the angle associated with the selected vertex.

2. The method of claim 1, wherein selecting a vertex of the polygon involves selecting the vertex of an acute angle in the polygon.

3. The method of claim 1, wherein the sizing process is continuous, and wherein the sizing process generates similar output polygons for similar sizing amounts.

4. The method of claim 1, wherein sizing the polygon involves generating a new edge in the polygon between a pair of replacement vertices.

5. The method of claim 1,
   wherein prior to sizing the polygon, the method further comprises assigning a projection speed to each replacement vertex in the set of replacement vertices; and
   wherein while sizing the polygon, the method further comprises moving each replacement vertex in the set of replacement vertices along the assigned projection path at the assigned projection speed.

6. The method of claim 5, wherein the method further comprises:
   receiving a set of clipping criteria for the angle associated with the selected vertex; and
   determining the projection path and the projection speed for each replacement vertex in the set of replacement vertices based on the set of clipping criteria.

7. The method of claim 1, wherein the first projection path for the first replacement vertex is different from the second projection path for the second replacement vertex.

8. The method of claim 1, wherein sizing the polygon involves one of: oversizing the polygon by the sizing amount, or undersizing the polygon by the sizing amount.

9. The method of claim 1, wherein sizing the polygon involves propagating an edge of the polygon in a direction perpendicular to the edge, thereby maintaining the topology of the polygon during sizing.

10. The method of claim 1, wherein sizing the polygon involves moving an unselected vertex of the polygon along the bisector direction of an angle associated with the unselected vertex.

11. The method of claim 1, wherein the method further comprises controlling the angle between the first projection path and the second projection path to control the amount of clipping on the angle associated with the selected vertex.

12. A non-transitory computer-readable storage medium storing instructions that when executed by a computer cause the computer to perform a method for sizing a polygon in a layout, the method comprising:
   receiving a polygon which is to be sized by a sizing amount;
   selecting a vertex of the polygon, wherein the vertex is formed by a first edge and a second edge;
   replacing the selected vertex with a set of replacement vertices, which includes a first replacement vertex and a second replacement vertex;
   assigning a projection path to each replacement vertex in the set of replacement vertices, which includes assigning a first projection path and a second projection path to the first replacement vertex and the second replacement vertex, respectively, wherein the first projection path and the second projection path are not perpendicular to either the first edge or the second edge; and
   sizing the polygon according to the sizing amount, which involves moving each replacement vertex in the set of replacement vertices along the assigned projection path, thereby creating a clipping on the angle associated with the selected vertex.

13. The non-transitory computer-readable storage medium of claim 12, wherein selecting a vertex of the polygon involves selecting the vertex of an acute angle in the polygon.

14. The non-transitory computer-readable storage medium of claim 12, wherein the sizing process is continuous, and wherein the sizing process generates similar output polygons for similar sizing amounts.

15. The non-transitory computer-readable storage medium of claim 12, wherein sizing the polygon involves generating a new edge in the polygon between a pair of replacement vertices.

16. The non-transitory computer-readable storage medium of claim 12,
   wherein prior to sizing the polygon, the method further comprises assigning a projection speed to each replacement vertex in the set of replacement vertices; and
   wherein while sizing the polygon, the method further comprises moving each replacement vertex in the set of replacement vertices along the assigned projection path at the assigned projection speed.

17. The non-transitory computer-readable storage medium of claim 16, wherein the method further comprises:
   receiving a set of clipping criteria for the angle associated with the selected vertex; and
   determining the projection path and the projection speed for each replacement vertex in the set of replacement vertices based on the set of clipping criteria.

18. The non-transitory computer-readable storage medium of claim 12, wherein the first projection path for the first replacement vertex is different from the second projection path for the second replacement vertex.

19. The non-transitory computer-readable storage medium of claim 12, wherein sizing the polygon involves one of:
   oversizing the polygon by the sizing amount, or undersizing the polygon by the sizing amount.

20. The non-transitory computer-readable storage medium of claim 12, wherein sizing the polygon involves propagating an edge of the polygon in a direction perpendicular to the edge, thereby maintaining the topology of the polygon during sizing.

21. The non-transitory computer-readable storage medium of claim 12, wherein sizing the polygon involves moving an unselected vertex of the polygon along the bisector direction of an angle associated with the unselected vertex.

22. The computer-readable storage medium of claim 12, wherein the method further comprises controlling the angle between the first projection path and the second projection path to control the amount of clipping on the angle associated with the selected vertex.

23. A system that sizes a polygon in a layout, comprising:
   a processor;
   a memory;
   a receiving mechanism configured to receive a polygon which is to be sized by a sizing amount;
   a selection mechanism configured to select a vertex of the polygon, wherein the vertex is formed by a first edge and a second edge;
   a replacing mechanism configured to replace the selected vertex with a set of replacement vertices, which includes a first replacement vertex and a second replacement vertex,
   wherein the replacing mechanism is further configured to assign a projection path to each replacement vertex in the set of replacement vertices, which includes assigning a first projection path and a second projection path to the first replacement vertex and the second replacement vertex, respectively, wherein the first projection path and the second projection path are not perpendicular to either the first edge or the second edge; and
   a sizing mechanism configured to size the polygon according to the sizing amount, wherein while sizing the polygon, the sizing mechanism moves each replacement vertex in the set of replacement vertices along the assigned projection path, thereby creating a clipping on the angle associated with the selected vertex.

\* \* \* \* \*